(12) United States Patent
Butler

(10) Patent No.: US 8,326,224 B2
(45) Date of Patent: Dec. 4, 2012

(54) HARVESTING POWER IN A NEAR FIELD COMMUNICATIONS (NFC) DEVICE

(75) Inventor: Paul Butler, Cirencester (GB)

(73) Assignee: Innovision Research & Technology PLC, Cirencester (GB)

( * ) Notice: Subject to any disclaimer, the term of this patent is extended or adjusted under 35 U.S.C. 154(b) by 205 days.

(21) Appl. No.: 12/863,614

(22) PCT Filed: Jan. 23, 2009

(86) PCT No.: PCT/GB2009/050059
§ 371 (c)(1),
(2), (4) Date: Jul. 20, 2010

(87) PCT Pub. No.: WO2009/093076
PCT Pub. Date: Jul. 30, 2009

(65) Prior Publication Data
US 2010/0291870 A1     Nov. 18, 2010

(30) Foreign Application Priority Data

Jan. 23, 2008 (GB) .................................. 0801225.4
Sep. 9, 2008 (GB) .................................. 0816477.4

(51) Int. Cl.
*H04B 5/00* (2006.01)
(52) U.S. Cl. ........ 455/41.1; 455/41.2; 455/68; 363/125; 235/492
(58) Field of Classification Search .................. 455/41.1, 455/41.2, 68, 334, 556.1, 560; 363/125; 235/492
See application file for complete search history.

(56) References Cited

U.S. PATENT DOCUMENTS

| | | | |
|---|---|---|---|
| 4,406,929 A * | 9/1983 | Pace et al. ..................... | 379/402 |
| 6,134,130 A | 10/2000 | Connell et al. | |
| 6,995,996 B2 * | 2/2006 | Youm ............................. | 363/98 |
| 2002/0118557 A1 | 8/2002 | Ohlsson | |
| 2003/0011780 A1 | 1/2003 | Dalhoff | |
| 2006/0128345 A1 | 6/2006 | Ootaka et al. | |
| 2007/0155442 A1* | 7/2007 | Watanabe et al. ............. | 455/572 |
| 2007/0249398 A1 | 10/2007 | Watanabe et al. | |

(Continued)

FOREIGN PATENT DOCUMENTS

EP     1231557 A2     8/2002

(Continued)

OTHER PUBLICATIONS

Saeid Hashemi et al. "A novel fully-integrated dropless voltage CMOS rectifier for wirelessly powered devices" Microelectronics, (2007), ICM 2007. International Conference ON, IEEE, Piscataway, NJ, USA, Dec. 29, 2007, pp. 333-336.

(Continued)

*Primary Examiner* — Tuan H Nguyen
(74) *Attorney, Agent, or Firm* — Sterne, Kessler, Goldstein & Fox P.L.L.C.

(57) ABSTRACT

A near field RF communicator has an antenna circuit (1020) coupled to an active switched rectifier (301) to rectify a received RF magnetic field signal. The active switched rectifier also has a passive mode of operation. A switching mechanism in the forward conducting arms of the rectifier is controlled by a comparator (309). A switching mechanism to control ground clamping of each respective input from the antenna circuit is provided by a coupling to the other respective input from the antenna circuit.

20 Claims, 4 Drawing Sheets

U.S. PATENT DOCUMENTS

2008/0259665 A1 * 10/2008 Brederlow et al. ............ 363/127

FOREIGN PATENT DOCUMENTS

| | | |
|---|---|---|
| EP | 1280099 A1 | 1/2003 |
| EP | 1852804 A9 | 8/2008 |
| WO | 2005124987 A1 | 12/2005 |
| WO | 2006130197 A2 | 12/2006 |
| WO | 2008117029 A2 | 10/2008 |

OTHER PUBLICATIONS

Yat-Hei Lam et al. "Integrated Low-Loss CMOS Active Rectifier for Wirelessly Powered Devices" IEEE Transactions on Circuits and Systems II; Express Briefs, IEEE Service Center, New York, NY, US, vol. 53, No. 12, Dec. 1, 2006, pp. 1378-1382.

* cited by examiner

HARVESTING POWER IN A NEAR FIELD COMMUNICATIONS (NFC) DEVICE

This invention relates to near field RF communicators and near field communications enabled devices.

Near field RF (radio frequency) communication is becoming more and more commonplace as is the use of such technology to transfer data. Near field RF communicators communicate through the modulation of the magnetic field (H field) generated by a radio frequency antenna. Near field RF communication thus requires an antenna of one near field RF communicator to be present within the alternating magnetic field (H field) generated by the antenna of another near field RF communicator by transmission of an RF signal (for example a 13.56 Mega Hertz signal) to enable the magnetic field (H field) of the RF signal to be inductively coupled between the communicators. The RF signal may be modulated to enable communication of control and/or other data. Ranges of up to several centimeters (generally a maximum of 1 meter) are common for near field RF communicators.

NFC communicators are a type of near field RF communicator that is capable in an initiator mode of initiating a near field RF communication (through transmission or generation of an alternating magnetic field) with another near field RF communicator and is capable in a target mode of responding to initiation of a near field RF communication by another near field RF communicator. The term "near field RF communicator" includes not only NFC communicators but also initiator near field RF communicators such as RFID transceivers or readers that are capable of initiating a near field RF communication but not responding to initiation of a near field RF communication by another near field RF communicator and target or responding near field RF communicators such as RFID transponders or tags that are capable of responding to initiation of a near field RF communication by another near field RF communicator but not of initiating a near field RF communication with another near field RF communicator. Hence NFC communicators can act as both RFID transceivers and RFID transponders and are able to communicate with other NFC communicators, RFID transceivers and RFID transponders.

In addition NFC communicators may be associated with or comprised within or attached to certain peripheral devices, for example SIM cards (e.g. UICC), Secure Elements, memory devices (for example MCU, RAM, ROM and non-volatile memory), display driver or other drivers. During operation the NFC communicator must also be able to communicate with and transfer data to and from such peripheral device.

There are several standards in existence which set out certain communication protocols and functional requirements for RFID and near field RF communications. Examples are ISO/IEC 14443, ISO 15693, ISO/IEC 18092 and ISO/IEC 21481.

NFC communicators may be comprised within a larger device, NFC communications enabled devices. Examples include mobile telephones, PDAs, computers, smart cards. When comprised within such NFC communications enabled devices the NFC communicator must be able to transfer data to and from the larger device and to and from any peripheral devices (including interface systems, such as the single wire protocol) associated with such larger device.

NFC communicators need to be able to respond to a variety of different received RF fields. Given the diversity of end applications it is not possible to assume that an NFC communicator will be able to rely on receiving a given field strength or alternatively that the field strength will continue at the same level during a communication cycle or cycles. If the field strength received by the functional parts of the NFC communicator is reduced to a low level then the operating voltage may fall and the functional parts of the NFC communicator will eventually cease to operate and the NFC communicator be unable to respond to a received signal.

Existing systems rely on the use of specific diodes, such as Schottky diodes which have a forward diode drop voltage which therefore limits the use of such diodes because they reduce the available operating voltage. Such structures are also often process specific and therefore limit the ability of the designer to port designs from one process to another. Such existing systems also provide very limited flexibility and/or intelligence and are dependent on the forward diode drop voltage relevant to the diode system in use. Such systems also have a limited or slow response to changes in received field which can impact on operability of NFC communicator functionality and/or ability of NFC communicator to respond to a received field.

The same problems may also exist for other near field RF communicators where there is a desire to port designs between processes or where the received RF field can vary.

SUMMARY OF INVENTION

An aspect of the present invention provides a near field RF communicator that alleviates at least some of the aforementioned problems. An aspect of the invention provides an NFC communicator comprising a rectifier circuit which is able to adjust quickly to changes in the received RF field. In a preferred embodiment the near field RF communicator is an NFC communicator.

A further aspect of the present invention provides a near field RF communicator comprising near field communicator functionality, a rectifier and a comparator wherein operation of rectifier is controlled in accordance with comparator output.

An aspect of the invention provides near field RF communicator comprising near field communicator functionality and at least one rectifier wherein such rectifier comprises at least one switch device and at least one comparator and wherein operation of the at least one switch device is controlled in accordance with comparator output.

In an embodiment the present invention provides a near field communicator comprising an inductive coupler for inductive coupling with a magnetic field and an actively switched rectifier, the actively switched rectifier comprising: a comparator coupled to a ground connection and to the rectifier output; and, at least one input coupled to the inductive coupler, the at least one input being coupled to: the rectifier output by a forward conduction path comprising at least one active rectifying element coupled to receive a control signal from the comparator; and to, a ground connection by a ground return path comprising at least one active rectifying element coupled to receive a control signal from another of the rectifier inputs.

An embodiment of the present invention comprises a comparator, the comparator comprising a plurality of active elements coupled to form at least a pair of opposing current mirrors, the point at which the current mirrors meet creating one of a current sink and a current source dependent on the currents provided to first and second inputs of the comparator.

An embodiment of the present invention comprises a comparator, the comparator comprising a plurality of active elements, each active element having first and second main electrodes and at least one control electrode, the control electrode being operable to control conduction between first and second main electrodes. The comparator further comprises first and second inputs, an output and a ground connection and a mirrored triplet of active elements the control electrodes of the triplet being mutually coupled together and the first electrode of the first and second active elements being coupled to the first comparator input, wherein the second electrode of the first active element of the triplet is coupled to its control electrode and, via a load, to a ground connection. The first electrode of the third active element of the triplet is coupled to the second comparator input. The comparator further comprises a mirrored pair of active elements, the control electrodes of the pair being coupled together and being coupled to the second electrode of the second active element of the pair and to the second electrode of the third active element of the triplet of active elements. The first electrode of each of the pair is coupled, optionally via load, to a ground connection and the second electrode of the first active element of the pair is coupled to the first electrode of the second active element of the triplet of active elements such that the difference between the current passed through the first active element of the pair and the current passed through the second active element of the triplet creates one of a current sink and a current source dependent on the currents provided to first and second inputs of the comparator.

An embodiment of the invention is a near field RF communicator wherein the output from the comparator relates directly or indirectly to a change in RF field received by the near field RF communicator.

An embodiment of the invention is a near field RF communicator wherein the comparator output relates directly or indirectly to a change in RF field received by the near field RF communicator as compared against a reference voltage.

An embodiment of the invention is a near field RF communicator operable such that changes in operating voltage of the near field communicator functionality caused by changes in received RF field are minimised.

An embodiment of the invention is a near field RF communicator wherein the at least one switch device is a forward conducting switch device.

An embodiment of the invention is a near field RF communicator wherein the at least one switch device is at least one of an NMOS or PMOS device.

An embodiment of the invention is a near field RF communicator wherein the at least one switch device is a bulk switched PMOS type device.

An aspect of the invention is a near field RF communicator comprising near field communicator functionality and at least one rectifier wherein such rectifier comprises at least one forward conducting switch device; at least one ground return path switch device and at least one comparator.

An embodiment of the invention is a near field RF communicator comprising at least one of additional diodes, additional gate to drain or diode coupled MOS or well diode or Schottky diode devices in parallel with the at least one forward conducting switch device.

In an embodiment the invention provides a near field RF communicator wherein said comparator comprises a voltage comparator.

In an embodiment the invention provides a near field RF communicator wherein said comparator comprises at least one mirrored PMOS device and at least one NMOS device.

In an embodiment the invention provides a near field RF communicator wherein the output from the comparator comprises a current source verses current sink difference generated between the at least one mirrored PMOS device and the at least one NMOS device.

In an embodiment the invention provides a near field RF communicator wherein the output from the comparator varies in accordance with received RF field.

In an embodiment the invention provides a near field RF communicator wherein the output from the comparator varies in accordance with received RF field as compared against a reference voltage.

In an embodiment the invention provides a near field RF communicator additionally comprising a chain of inverters.

In an aspect the invention provides a near field RF communicator having an inductive coupler to enable inductive coupling with a magnetic field of an RF signal and at least one rectifier to rectify an inductively coupled RF signal, the at least one rectifier comprising at least one active rectifying element controlled by at least one control signal.

In an embodiment the present invention provides a near field RF communicator wherein the at least one active rectifying element also provides or is associated with a forward conduction path not controlled by the at least one control signal.

In an embodiment the present invention provides a near field RF communicator wherein the forward conduction path is provided by at least one of: a diode inherent in the active rectifying element; a diode coupled transistor; a well diode; a body diode; or a Schottky diode.

In an embodiment the present invention provides a near field RF communicator wherein each active rectifying element comprises: first and second main electrodes; and, at least one control electrode operable to control conduction along a conduction path between the first and second main electrodes.

In an embodiment the present invention provides a near field RF communicator wherein the inductive coupler is coupled to two inputs of the rectifier and each input is provided with a switchable ground return path to couple each respective input to a ground connection.

In an embodiment the present invention provides a near field RF communicator wherein each switchable ground return path comprises at least one active rectifying element.

In an embodiment the present invention provides a near field RF communicator wherein each active rectifying element providing a ground return path is coupled to the respective other one of the two rectifier inputs such that conduction along that ground return path is dependent on a voltage difference between the two rectifier inputs.

In an embodiment the present invention provides a near field RF communicator further comprising a comparator to provide the control signal to the at least one active rectifying element.

In an embodiment the present invention provides a near field RF communicator wherein the comparator is configured to compare currents.

In an embodiment the present invention provides a near field RF communicator wherein the current comparator comprises two or more current mirrors.

In an embodiment the present invention provides a near field RF communicator wherein an output of the comparator output is coupled to one or more amplifiers.

In an embodiment the present invention provides a near field RF communicator wherein the comparator is coupled to compare one or more input signals with a rectifier output signal and at least one comparator output is coupled to provide the control signal to the at least one active rectifying element.

In an embodiment the present invention provides a near field RF communicator wherein the comparator is configured to provide the control signal to causes at least one active rectifying element to couple one rectifier input to the rectifier output in the event that the voltage at that input is greater than the voltage at the output.

In an embodiment the present invention provides a near field RF communicator wherein the output from the comparator comprises a current source verses current sink difference generated between coupled current mirrors.

In an embodiment the present invention provides a near field RF communicator comprising a plurality of rectifiers coupled to the same comparator.

In an embodiment the present invention provides a near field RF communicator comprising a chain of inverters coupled to modify a control signal provided by the comparator.

In an aspect the present invention provides a near field RF communicator having an inductive coupler to enable inductive coupling with a magnetic field of an RF signal and at least one rectifier to rectify an inductively coupled RF signal, the at least one rectifier comprising first to fourth arms each containing a respective one of first to fourth active elements each having first and second electrodes and a control electrode to control a conduction path between the first and second electrodes, the first electrodes of the first and second active elements being coupled to a ground coupling, the second electrodes of the first and second active elements being coupled to first and second inputs, respectively, the control electrodes of the first and second active elements being coupled to the second and first inputs respectively, the second electrodes of the second and fourth active elements and of the first and third active elements being coupled together, the first electrodes of the third and fourth active elements being coupled to an output of the at least one rectifier, and the control electrodes of the third and fourth active elements being coupled to respective outputs of a comparator that is coupled to the first and second inputs.

In an embodiment the present invention provides a near field RF communicator wherein each of the third and fourth active elements comprises a diode in parallel with the conduction path.

In an embodiment the present invention provides a near field RF communicator wherein the comparator comprises for each input a current mirror comparator configured to provide an output voltage determined by a difference between a current resulting from a voltage at the input and a current resulting from a reference voltage.

In an embodiment the present invention provides a near field RF communicator wherein the at least one active rectifying element is at least one of an NMOS or PMOS device.

In an embodiment the present invention provides a near field RF communicator wherein at least one active rectifying element is a bulk switched PMOS type device.

In an embodiment the present invention provides a near field RF communicator wherein the near field RF communicator is a CMOS device.

In an aspect the present invention provides a near field RF communicator substantially as herein described with reference to the accompanying drawings.

In an embodiment the present invention provides a near field RF communicator wherein the near field RF communicator is an NFC communicator In an embodiment the invention provides a near field RF communications enabled device comprising a near field RF communicator in accordance with any of the herein described aspects and embodiments of the invention.

In an embodiment the present invention provides a peripheral device comprising a near field RF communicator in accordance with any of the herein described aspects and embodiments of the invention.

In an embodiment the invention provides a peripheral device coupled with a near field RF communicator in accordance with any of the herein described aspects and embodiments of the invention. In one possibility the peripheral device is at least one of a secure element, smart card, SIM card, display device, and an interface system.

In an aspect there is provided a near field RF communicator comprising inductive coupling means for enabling inductive coupling with a magnetic field of an RF signal and rectifying means for rectifying an inductively coupled RF signal, the rectifying means comprising active rectifying means controlled by at least one control signal.

In an aspect the invention provides a near field RF communicator comprising near field communicator functionality and at least one rectifier wherein such rectifier comprises at least one switch device and at least one comparator and wherein operation of the at least one switch device is controlled in accordance with comparator output.

An embodiment of a near field RF communicator has an antenna circuit coupled to an active switched rectifier to rectify a received RF magnetic field signal. The active switched rectifier also has a passive mode of operation. A switching mechanism in the forward conducting arms of the rectifier is controlled by a comparator. A switching mechanism to control ground clamping of each respective input from the antenna circuit is provided by a coupling to the other respective input from the antenna circuit.

Embodiments of the present invention will now be described, by way of example, with reference to the accompanying drawings, in which.

With reference to the drawings in general, it should be understood that any functional block diagrams are intended simply to show the functionality that exists within the device and should not be taken to imply that each block shown in the functional block diagram is necessarily a discrete or separate entity. The functionality provided by a block may be discrete or may be dispersed throughout the device or throughout a part of the device. In addition, the functionality may incorporate, where appropriate, hard-wired elements, software elements or firmware elements or any combination of these. The near field RF communicator may be provided wholly or partially as an integrated circuit or collection(s) of integrated circuits.

Figure 1:
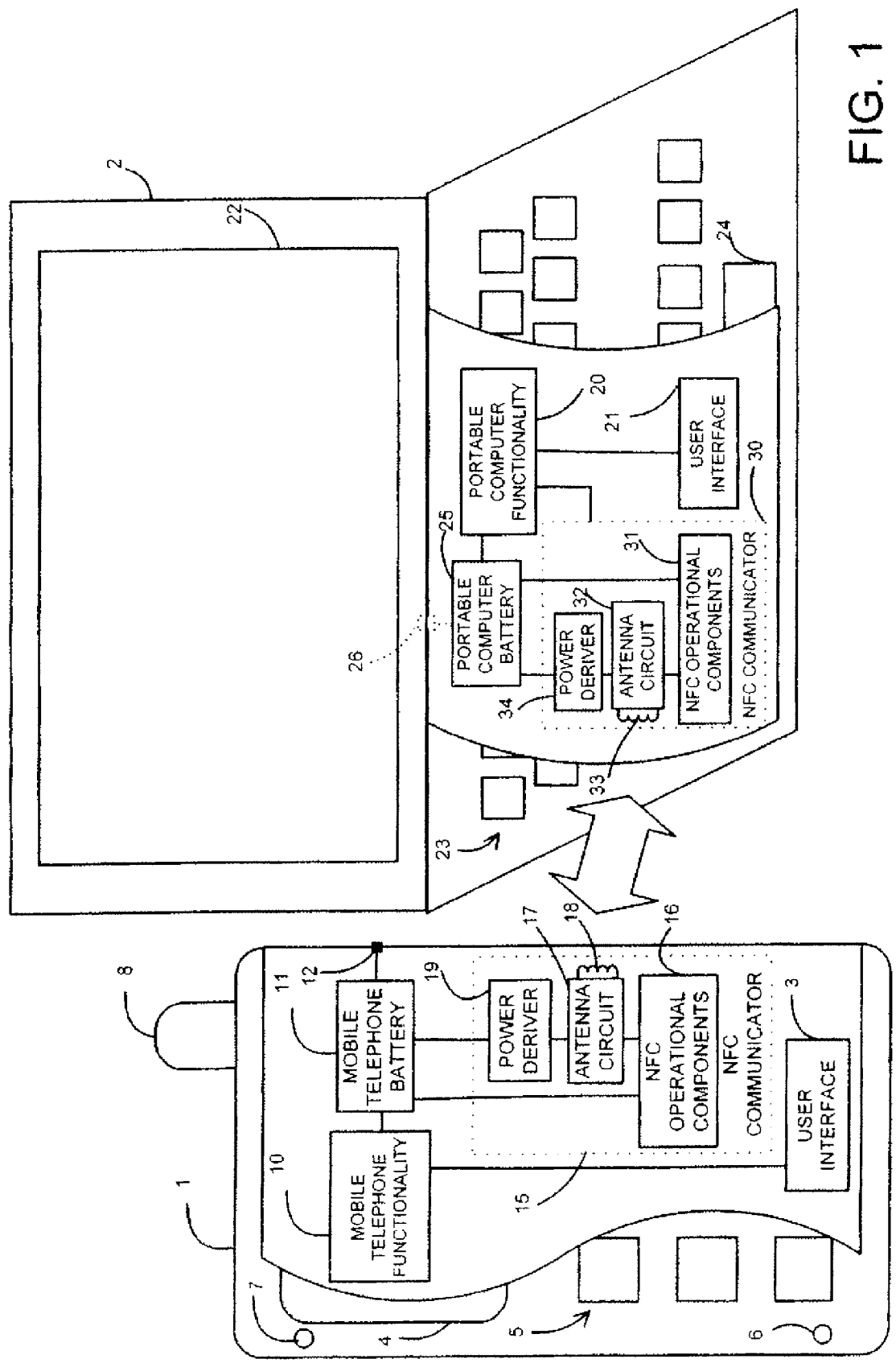
FIG. 1 shows a representational diagram illustrating communication between two devices comprising NFC communicators.

Referring now specifically to FIG. 1, there is shown a representational diagram illustrating communication between two NFC communications enabled devices. In FIG. 1 the representations of the NFC communications enabled devices have been shown partly cut-away and the functionality provided by the NFC communications enabled devices illustrated by way of a functional block diagram within the NFC communications enabled device.

As shown in FIG. 1, one NFC communications enabled device comprises a mobile telephone (cellphone) 1 and the other NFC communications enabled device comprises a portable computer 2 such as a notebook or laptop computer.

The mobile telephone 1 has the usual features of a mobile telephone including mobile telephone functionality 10 (in the form of, usually, a programmed controller, generally a processor or microprocessor with associated memory or data storage, for controlling operation of the mobile telephone in combination with a SIM card), an antenna 8 for enabling connection to a mobile telecommunications network, and a user interface 3 with a display 4, a keypad 5, a microphone 6 for receiving user voice input and a loudspeaker 7 for outputting received audio to the user. The mobile telephone also has a chargeable battery 11 coupled to a charging socket 12 via which a mains adapter (not shown) may be connected to enable charging of the battery 11. The mobile telephone 1 may have an alternative or additional power supply (not shown), for example a reserve battery or emergency battery.

Similarly the portable computer 2 has the usual features of a portable computer including portable computer functionality 20 in the form of, usually, a processor with associated memory in the form of ROM, RAM and/or hard disk drive, one or more removable media drives such as a floppy disk drive and/or a CDROM or DVD drive, and possibly a communications device for enabling the portable computer to connect to a network such as the Internet. The portable computer 2 also includes a user interface 21 including a display 22, a keyboard 23 and a pointing device, as shown a touchpad 24. The portable computer 2 also has a chargeable battery 25 coupled to a charging socket 26 via which a mains adapter (not shown) may be connected to enable charging of the battery 25.

In addition, as shown in FIG. 1, both NFC communications enabled devices 1 and 2 have an NFC communicator 15 and 30. As shown, the NFC communicators 15 and 30 are incorporated within the larger devices and, as with the other functional blocks, may be discrete entities within the host devices or may be provided by features dispersed throughout or integrated within the host device or a part of the host device.

Each NFC communicator 15 and 30 comprises NFC operational components 16 and 31 for, as will be described below, enabling control of the NFC functionality and generation, modulation and demodulation of an RF signal. Each NFC communicator 15 and 30 also comprises an antenna circuit 17 and 32 comprising an inductor or coil in the form of an antenna 18 and 33. The antenna circuits 17 and 32 enable an alternating magnetic field (H field) generated by the antenna of one near field RF communicator 15 (or 30) by transmission of an RF signal (for example a 13.56 Mega Hertz signal) to be inductively coupled to the antenna of the other near field RF communicator 30 (or 15) when that antenna is within the near field of the RF signal generated by the one near field RF communicator 15 (or 30).

The NFC communicators 15 and 30 are coupled to the mobile telephone and portable computer functionality 10 and 20, respectively, to enable data and/or control commands to be sent between the NFC communicator and the host device and to enable user input to the NFC communicator. Communication between the user interface 3 or 21 and the NFC communicator 15 or 30 is via the host device functionality 11 or 20, respectively.

Each NFC communicator 15 and 30 also comprises a power provider 19 and 34. The power providers 19 and 34 may be power supplies within the host device or specific to the NFC communicators 15 and 30, for example a button cell battery, or other small battery. As another possibility or additionally as shown by dashed lines in FIG. 1, one or both of the power providers 19 and 34 may simply comprise a coupling to derive power from the corresponding device battery 11 or 25.

It will be appreciated that FIG. 1 shows only examples of types of host devices. A host device may be another type of electrical device such as a personal digital assistant (PDA), other portable electrical device such as a portable audio and/or video player such as an MP3 player, an IPOD®, CD player, DVD player or other electrical device. As another possibility the NFC communicator (15 or 3) may be comprised within or coupled to a peripheral device, for example in the form of a smart card or other secure element which may be stand alone or comprised within or intended to be inserted into another electrical device. For example a SIM card for use in a mobile telephone. As a further possibility such peripheral devices may comprise interfacing systems or protocols such as the single wire protocol.

Also, rather than being incorporated within the host device, the NFC communicator 15 or 30 may be associated with the host device, for example by a wired or wireless coupling. In such a case, a housing of the NFC communicator may be physically separate from or may be attached to the housing of the host device; in the later case, the attachment may be permanent once made or the NFC communicator may be removable. For example, the NFC communicator may be housed within: a housing attachable to another device; a housing portion, such as a fascia of the NFC communications enabled device or another device; an access card; or may have a housing shaped or configured to look like a smart card. For example an NFC communicator may be coupled to a larger device by way of a communications link such as, for example, a USB link, or may be provided as a card (for example a PCMCIA card or a card that looks like a smart card) which can be received in an appropriate slot of the larger or host device.

In addition, one or both of the NFC communications enabled devices may be a standalone NFC communicator, that is it may have no functionality beyond its NFC communications functionality.

Figure 2:
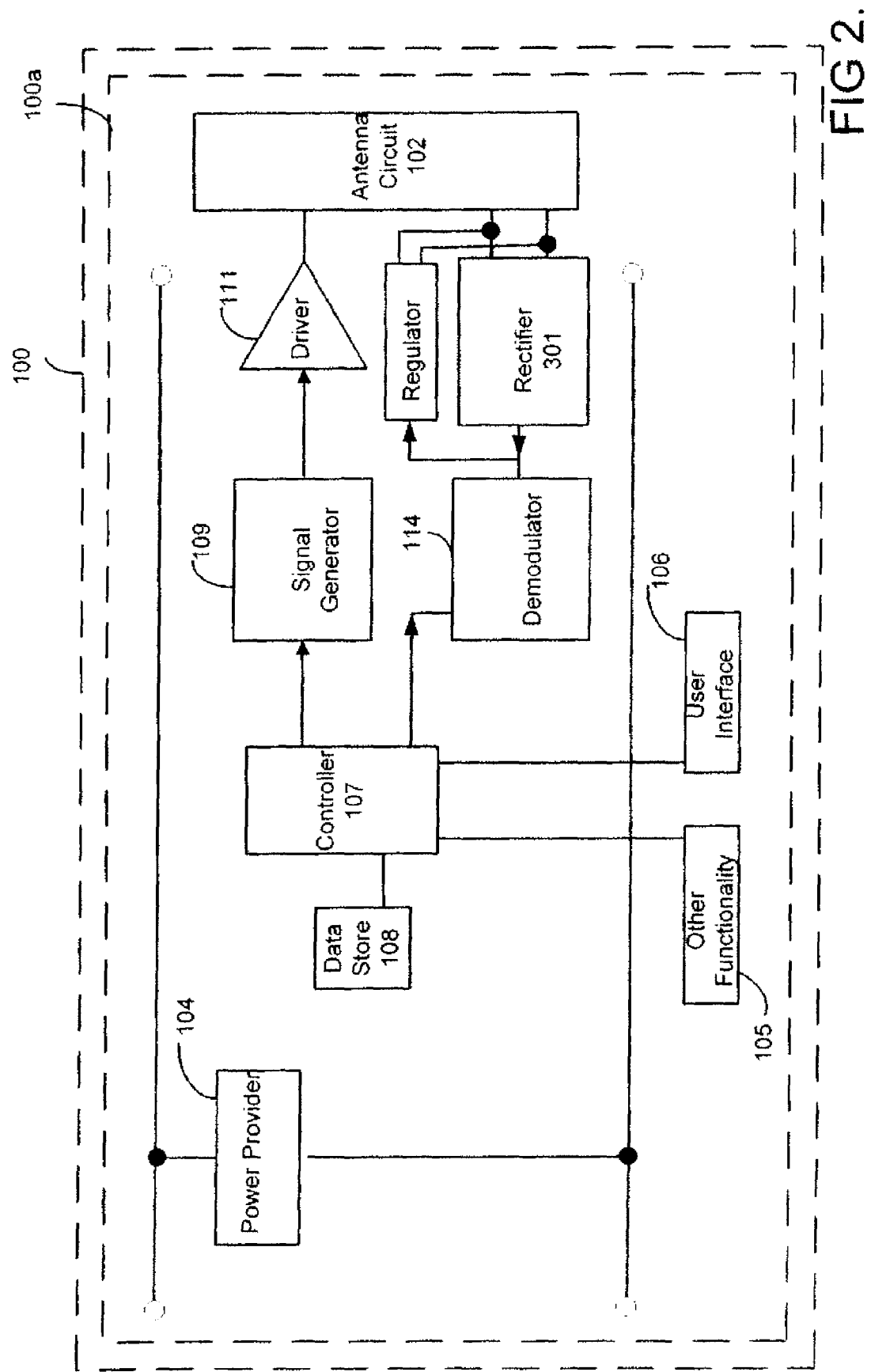
FIG. 2 shows an embodiment of an NFC communicator according to an aspect of the present invention.

FIG. 2 shows a functional block diagram of an NFC communications enabled device 100 in accordance with the invention to illustrate in greater detail one way in which the NFC operational components of an NFC communications enabled device embodying the invention may be implemented.

In this example, the NFC communications enabled device 100 comprises an NFC communicator 100a having NFC operational components including an antenna circuit 102, power provider 104, controller 107, data store 108, signal generator 109 and demodulator 114.

The power provider 104 may be any one or more of the types of power providers discussed above. In the interests of simplicity, power supply couplings from the power provider 104 to other components are not shown in FIG. 2.

The NFC communications enabled device 100 may or may not also have or be capable of being connected or coupled with at least one of other functionality 105 (for example functionality of a host device or peripheral device such as described above) and a user interface 106.

The NFC operational components include a demodulator 114 coupled between the antenna circuit 2 and the controller 107 for demodulating a modulated RF signal inductively coupled to the antenna circuit 102 from another near field RF communicator in near field range and for supplying the thus extracted data to the controller 107 for processing. The NFC operational components may also include an amplifier for amplifying an RF signal inductively coupled to the antenna circuit 102.

In addition the NFC operational components include components for enabling modulation of an RF signal to enable data to be communicated to another near field RF communicator in near field range of the NFC communicator 100a. As shown in FIG. 2, these components comprise a signal generator 109 coupled via a driver 111 to the antenna circuit 102. In this example, the signal generator 110 causes modulation by gating or switching on and off the RF signal in accordance with the data to be communicated. The NFC communicator may use any appropriate modulation scheme that is in accordance with the standards and/or protocols under which the NFC communicator operates. As another possibility a separate or further signal controller may be incorporated within the NFC operational components to control modulation of the signal generated by the signal generator 109 in accordance with data or instructions received from the controller 107.

The NFC operational components also include a controller 107 for controlling overall operation of the NFC communicator. The controller 107 is coupled to a data store 108 for storing data (information and/or control data) to be transmitted from and/or data received by the NFC communications enabled device. The controller 107 may be a microprocessor, for example a RISC processor or other microprocessor or a state machine. Program instructions for programming the controller and/or control data for communication to another near field RF communicator may be stored in an internal memory of the controller and/or the data store.

The NFC communicator 100a may operate in an initiator mode (that is as an initiating near field RF communicator) or a target mode (that is as a responding near field RF communicator), dependent on the mode to which the NFC communicator is set. The mode may be determined by the controller 107 or may be determined in dependence on the nature of a received near field RF signal. When in initiator mode, an NFC communicator initiates communications with any compatible responding near field RF communicator capable of responding to the initiating NFC communicator (for example an NFC communicator in target mode or an RFID tag or transponder) that is in its near field range, while when in target mode an NFC communicator waits for a communication from a compatible initiating near field RF communicator (for example an NFC communicator in initiator mode or an RFID initiator or transceiver). As thus used, compatible means operable at the same frequency and in accordance with the same protocols, for example in accordance with the protocols set out in various standards such as ISO/IEC 18092, ISO/IEC 21481, ISO/IEC 14443 and ISO/IEC 15693. NFC communicators commonly operate at or around 13.56 MHz.

When in initiator or target mode, the NFC communicator may communicate in accordance with an active or passive protocol. When using an active protocol the initiating NFC communicator will transmit an RF field and following completion of its data communication turn off its RF field. The responding near field RF communicator (target) will then transmit its own RF field and data before again turning off the RF field and so on. When using a passive protocol the NFC communicator (initiator) will transmit and maintain its RF field throughout the entire communication sequence. The protocol used will depend on instructions received form the controller 107 and the response received from a responding near field RF communicator.

In FIG. 2 control of operation of the NFC communicator is through controller 107. As another possibility and where the NFC communicator is comprised as part of a host device, control of the operation of the NFC communicator may be directed by the host device, for example through other functionality 105. In such circumstances all or part of the control may be provided by other functionality 105. For example the NFC communicator controller 107 may control modulation and modulation protocols whereas the data to be transmitted may be provided by other functionality 105.

The NFC communicator also comprises an antenna circuit 102. The design of the antenna circuit will depend on the NFC communicator 100 and the environment in which it operates. For example the antenna circuit may be in the form described for co-pending application number GB 0705635.1 which corresponds to International Patent Application No. PCT/GB2008/00992.

An NFC communicator in accordance with the invention will also comprise a rectifier 301 and regulator 310. The rectifier 301 is described in more detail in FIG. 3. The rectifier will control the response of the NFC communicator to variations in received RF field. The regulator 310 limits the upper operating voltage range of the NFC functionality (308 in FIG. 3) thereby protecting the NFC communicator where received field strength is greater than that in which the circuits/operational components can operate. For example the regulator may limit the voltage to 3.3 volts. Any appropriate regulator circuit may be used to provide this limitation.

Figure 3:
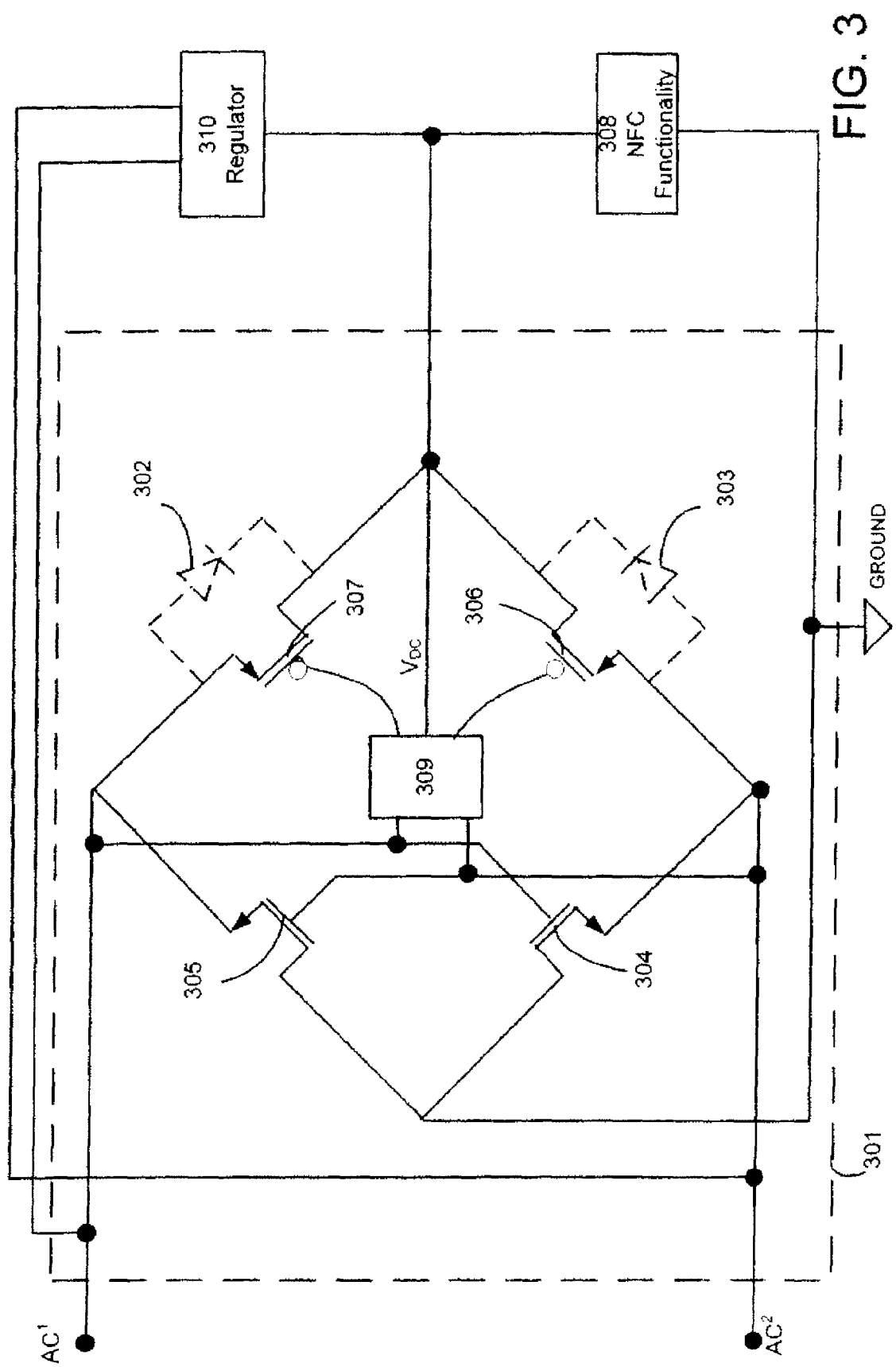
FIG. 3 shows an embodiment of a rectifier circuit for an NFC communicator according to an aspect of the present invention.

FIG. 3 shows the rectifier circuit of a near field RF communicator in accordance with the invention in more detail. In this example the near field RF communicator is assumed to be an NFC communicator, such as that described for FIGS. 1 and 2. NFC functionality 308 will, for example correspond to NFC functionality 114, 107, 108, 109, 111 in FIG. 2. The rectifier 301 has two voltage inputs $AC^1$ and $AC^2$ which may be taken directly from the antenna circuit of the NFC communicator. QUERY $AC^2$ will be the inverse of $AC^1$. The antenna circuit is designed to couple to a varying magnetic field to provide an AC voltage across the terminals $AC^1$, $AC^2$.

Coupled between terminals $AC^1$, $AC^2$ is a four armed bridge which comprises forward gate controlled switches (forward conducting switch devices) 306 and 307 and ground return path gate controlled switches (ground return path switch devices) 304 and 305. The gate of each switch controls a conduction path via a conduction channel of the switch. The conduction channel of switch 307 provides a conduction path to connect AC terminal $AC^1$ with rectifier output $V_{DC}$. The conduction channel of 306 provides a conduction path to connect AC terminal $AC^2$ with rectifier output $V_{DC}$. Optionally the rectifier 301 may comprise diodes 302 and 303 (shown in dotted lines) in parallel with switches 306 and 307. The conduction channel of gate controlled switch 304 couples $AC^2$ to ground and the gate terminal of 304 is coupled to $AC^1$. The conduction channel of switch 305 couples $AC^1$ to ground and the gate terminal of 305 is coupled to $AC^2$.

The gate terminals of gate controlled switches 306 and 307 are coupled to and controlled by a comparator 309. Comparator 309 is coupled to $AC^1$ and $AC^2$, and to the gate terminals of gate controlled switches 306 and 307 and to the rectifier output $V_{DC}$.

Coupled between rectifier output $V_{DC}$ and ground is NFC functionality 308. Regulator 310 is coupled to AC terminals and to rectifier output $V_{DC}$ to regulate the voltage provided to the rectifier 301 and to the NFC functionality 308.

Rectifier 301 acts to rectify an AC signal $AC^1$, $AC^2$, to provide a DC voltage at rectifier output $V_{DC}$. The rectified signal is used to provide a voltage to NFC functionality 308.

When $AC^1$ is high 304 is conducting and $AC^2$ is clamped to ground and when $AC^2$ is high 305 is conducting so $AC^1$ is clamped to ground.

Comparator 309 separately compares signals $AC^1$ and $AC^2$ with $V_{DC}$ and acts to render 306 conducting in the event that $AC^2$ is greater than $V_{DC}$ and to render 307 conducting in the event that $AC^1$ is greater than $V_{DC}$. This has the effect of selecting whichever of $AC^1$ and $AC^2$ is greater than $V_{DC}$ and of disconnecting the rectifier 301 from $V_{DC}$ where neither $AC^1$ nor $AC^2$ is greater than $V_{DC}$. In other words, 306 and 307 only ever provide forward conducting paths so there can be no current flow from $V_{DC}$ to either $AC^1$ or $AC^2$.

Where power provider 104 (FIG. 2) is not fully functional, for example a battery of an NFC device or a power supply of a host device is depleted or removed, the output of comparator 309 may not provide sufficient voltage to meet the gate threshold of switches 306 and 307. In these circumstances 302 and 303 enable the rectifier to act in a passive mode without the need for active switching of 306 and 307. Components of the NFC functionality 308 or regulator 310, or other components provide capacitive storage. This enables rectifier 301 to store energy when operating in a passive mode by charging this capacitive storage. Once sufficient energy has been stored the rectifier is able to begin operating in a more efficient active switching mode.

The nature of the devices used 306, 307, 302, 303, 304, 305 will depend on the design and process constraints. In this example switches 304 and 305 are enhancement mode NMOS transistors and 306 and 307 are enhancement mode bulk switched PMOS type transistors. Diodes 302 and 303 may be diode coupled MOS transistors or they may be inherent well or body diodes formed between the back gate and the source electrode of MOS transistors.

Forming components 306, 307, 302, 303, 304, 305, 309 of the rectifier from CMOS transistors enables an entire chip to be manufactured by a standard process and no additional semiconductor manufacturing step is necessary such as might be required by the use of Schottky diodes. This avoids the requirement for complex additional manufacturing processes and reduces the costs associated with manufacture.

Passive rectifiers dissipate power because of diode forward-bias voltage (diode drop). Active switching of forward switches 306 and 307, driven by comparator 309 limits losses in the rectifier and enables substantially most of the derived power to be provided to the NFC functionality 308 and the regulator 310. In some examples the rectifier will provide a DC voltage only 100 mV less than the peak voltage provided by an inductively coupled AC voltage $AC^1$, $AC^2$.

The above described features provide a rectifier having improved adaptability, efficiency and simplicity of manufacture.

The rectifier is also connected to NFC functionality. NFC functionality 308 requires a minimum voltage to operate, for example 1.5V. Rectifying a greater portion of the inductively coupled signal decreases the minimum level of coupled signal at which the NFC functionality may operate. This in turn increases the operating distance range of an NFC communicator. As described above, operation of switches 306 and 307 is controlled via comparator 309. The comparator 309 compares the inductively coupled signal (at $AC^1$ and $AC^2$) with $V_{DC}$.

Figure 4:
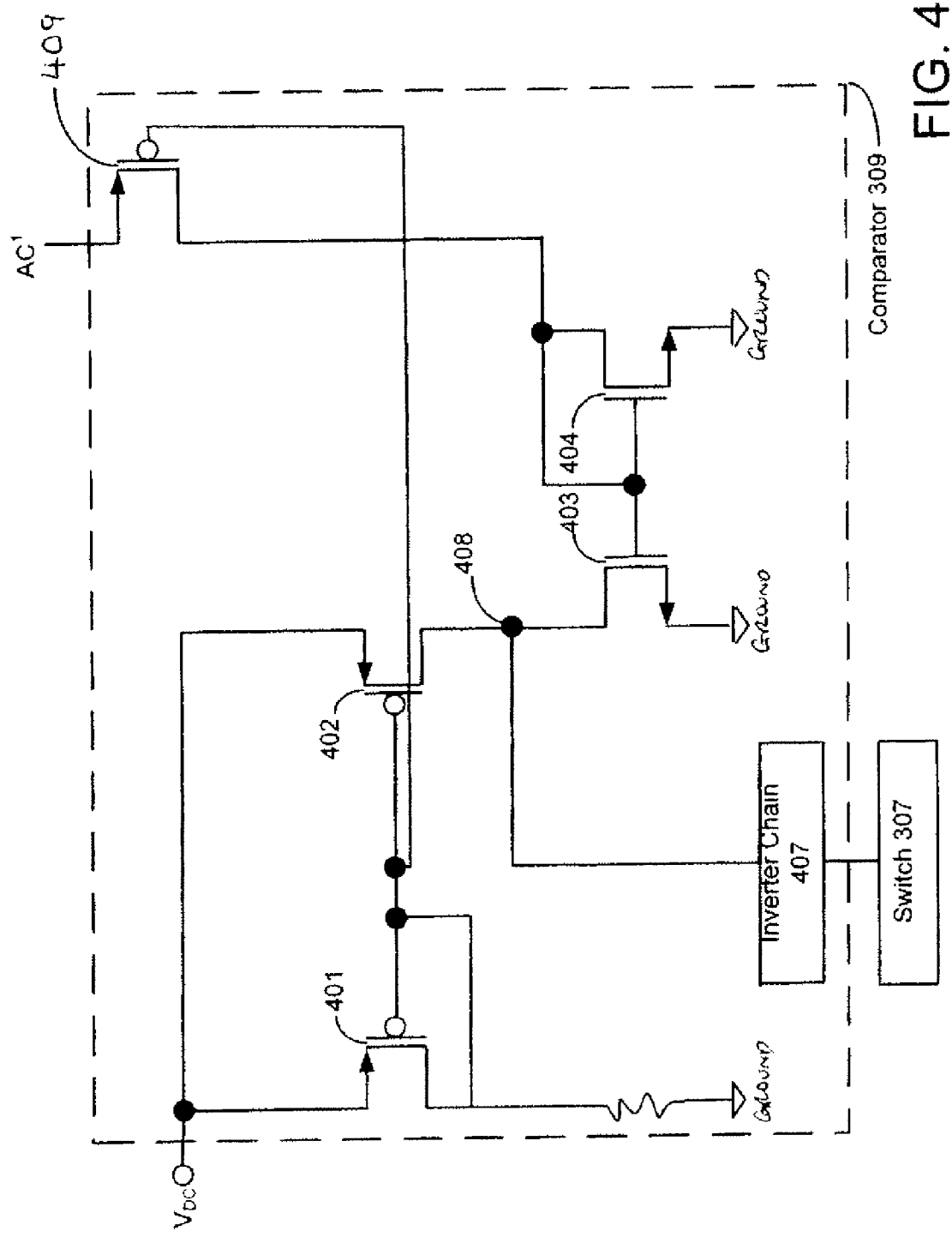
FIG. 4 shows a diagram to illustrate an embodiment of a comparator for an NFC communicator according to an aspect of the present invention.

FIG. 4 shows a diagram to illustrate an example of a comparator that may be used in the rectifier shown in FIG. 3.

Comparator 309 has at least two sections, each section comprising two input terminals, one coupled to $V_{DC}$ and one coupled to at most one of $AC^1$ and $AC^2$, and one output terminal 408 coupled, via amplifier stages 407, to at most one of the switches 306 and 307. The structure of one of these sections of comparator 309 is described below with reference to FIG. 4.

Coupled to the first input terminal, $V_{DC}$, are the source terminals of PMOS transistors 401 and 402. The gate terminals of 401 and 402 are connected to each other and to the drain terminal of 401. The drain terminal of 401 is coupled, via a load (not shown) to ground. The drain terminal of 402 is connected to output terminal 408 and to the drain terminal of NMOS transistor 403. The gate terminal of 403 is coupled to the gate and drain terminals of NMOS transistor 404, and to the drain terminal of a third PMOS transistor 408. The source terminals of 403 and 404 are both coupled to ground.

The gate terminal of 409 is coupled to the gate terminals of 401 and 402. The source terminal of 409 is coupled to an AC comparator input terminal, which in the example of FIG. 4 is $AC^1$.

The comparator compares an AC source current with a current produced by $V_{DC}$ and provides an output to the gate terminals of switches 306 or 307 which is dependent on this comparison.

At any time the comparator output may bias the gate of either 306 or 307, but not both, to provide a conduction path between one terminal of the AC source and $V_{DC}$. If neither $AC^1$ nor $AC^2$ is higher than $V_{DC}$ the comparator will not bias either 306 or 307 to provide a conduction path between the AC source and $V_{DC}$. In some examples multiple rectifiers may be used and, optionally, switches 306 and 307 may each be multiple parallel switches.

As described above the comparator has at least two sections, the function of one of those sections will now be described in more detail with reference to FIG. 4.

The current through PMOS transistor 408, which is representative of an AC source current, is compared with the $V_{DC}$ current through a series of mirrored PMOS transistors 401 and 402 and NMOS transistors 403 and 404.

When the current through transistor 403 is higher than the current through transistors 401 and 402, a current source verses current sink difference will be generated between PMOS transistor 402 and NMOS transistor 403 resulting in a voltage decrease at node 408.

When the current through transistor 403 is lower than the current through transistor 401 and 402, a current source verses current sink difference will be generated between PMOS transistor 402 and NMOS transistor 403, but this time in the opposite orientation. The voltage at node 408 will therefore increase.

The difference between the two input currents is provided from the junction 408 to the amplifier stage 407. The output of the amplifier stage 407 is coupled to the gate of gate controlled switch 307 to connect $AC^1$ to $V_{DC}$ in the event that $AC^1$ is greater than $V_{DC}$.

Only one AC source input $AC^1$ is shown in FIG. 4 but transistors 403, 404 and 408 and amplifier stage 407 are replicated for both AC source inputs ($AC^1$ and $AC^2$ as shown in FIG. 3) for their respective switch transistor outputs (306 for $AC^2$ and 307 for $AC^1$).

One set of amplifier stage 407 to switch control outputs 307 is shown in FIG. 4 but there may be multiple sets.

Advantageously the use of current based comparator 309 provides power and efficiency gains over voltage comparators because: there is no need to provide a bandgap reference or to provide significant power to op-amps which may have supply and input range limitations; and, a current mirror based comparator can inherently adapt to field power levels and will draw less power in low fields. Further advantageously this comparator consists of CMOS transistors and can be manufactured as part of the same process as the rest of rectifier 301 by a standard process and no additional semiconductor manufacture step is required.

The threshold levels of the components of the circuit can be chosen to adjust the operating parameters of the circuit, for example to adjust the sensitivity of the circuit to differences between $V_{DC}$ and the AC source, or to adjust the $V_{DC}$ level provided by the circuit or required to operate the circuit.

This enables the circuit to be very flexible to changes in field strength and maximises operating range by allowing the maintenance of good operating voltages in significantly lower fields than might otherwise be possible.

Amplifier stages 407 can be used to amplify the change in voltage at node 408 and may be realised by a chain of inverters.

The description and the accompanying drawings provide examples of the invention and further examples and modifications are envisaged which do not depart from the scope of the appended claims. For example, the antenna circuit may be coupled in single-ended or differential mode. Accordingly, a rectifier may rectify a full cycle of a wave, or half a cycle.

Although the use of only one rectifier circuit has been described multiple rectifier circuits can be used. Such circuits may use the same or different $V_{DC}$ reference voltages which may be taken from different parts or components of the NFC device or may be operative at different times or under different circumstances.

As will be appreciated by the skilled practitioner, by making appropriate modifications to the circuits other combinations gate controlled switches may be provided by any active rectifying element, for example bipolar transistors, JFET transistors, or NMOS or PMOS transistors operating in either enhancement or depletion mode may be used. Diodes may be externally provided diodes, diode coupled MOS transistors, inherent well or bulk diodes, or they may be specifically provided, for example as Schottky diodes. The switch devices 304-307 can be any appropriate type of NMOS or PMOS type device and can employ fixed or bulk switching schemes.

As described above, the NFC functionality may have a voltage range starting at 1.5 volts and extending up to and limited at 3.3 volts. There will be a given device voltage drop associated across devices 302 and 303. The level of voltage drop will depend on the type of device used. Operation of the forward conducting current is predominantly controlled in accordance with switch devices 306 and 307. In the absence of devices 302 and 303 forward current is exclusively controlled by switches 306 and 307. Where the $AC^1$ voltage is sufficiently high to provide NFC functionality 308 with sufficient operating voltage, switch 307 will be closed circuit. Current will flow through device 307 and NFC functionality will receive voltage at $AC^1$ less a very small voltage drop across switch device 307. The same applies to switch device 306 in relation to voltage $AC^2$. Current flow through these switch devices 306 and 307 limits any significant voltage drop and therefore reduction in operating voltage seen across rectifier 301. NFC functionality 308 is thereby able to operate at lower field strength than would otherwise be possible. In addition if the RF field changes, switch devices 306 and 307 permit rapid response within the circuit by allowing a higher current and wider current handling range for a relatively small switch device silicon area.

As described above, operation of switches 306 and 307 is controlled via comparator 309. As described above the comparator 309 is a voltage comparator which compares the voltage received from an external field (AC source, represented by $AC^1$ and $AC^2$ in FIG. 3) with a reference voltage (referred to as VDC in FIG. 4). The voltage comparator shown in FIG. 4 relies on comparison between the current seen through a PMOS device 408, which is representative of the AC source current, and the current through a series of mirrored PMOS devices 401 and 402.

In addition, one set of switch device outputs 307 is shown in FIG. 4 but there may be multiple sets.

Although specific types of devices (PMOS or NMOS for example) are mentioned above, it will be appreciated that any appropriate type of device may be used.

Given the changes in voltage seen at node 408 can be small, a chain of inverters 407 can be used to amplify the change in voltage. Where change in voltage is sufficient then switch device 307 will be opened or closed accordingly.

In the above examples, only one rectifier circuit is used. As another possibility, multiple rectifier circuits can be used. Such circuits may use the same or different VDC reference voltages or be operative at different times or under different circumstances.

The rectifier described above may be used in the power supply path to any appropriate part of the other functionality including any appropriate part of a peripheral or host device within which the NFC communicator is provided or with which the NFC communicator is associated.

In the above embodiments the invention is described in connection with an NFC communicator. It will be apparent to the skilled man that the same system could be used in any near field RF communicator and has particular advantages where changes in received field strength need to be detected quickly.

The above embodiments are to be understood as illustrative examples of the invention. Further embodiments of the invention are envisaged. It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention, which is defined in the accompanying claims.

The invention claimed is:

1. An apparatus, comprising: a comparator configured to compare an input voltage to an output voltage to provide a control signal; and an active switch configured to establish a conducting path to couple the input voltage to the output voltage when the control signal indicates the input voltage is greater than the output voltage and to not establish the conducting path when the control signal indicates the input voltage is less than the output voltage.

2. The apparatus of claim 1, further comprising:
a second active switch configured to couple a second input voltage to a ground in response to the input voltage being greater than zero.

3. The apparatus of claim 2, further comprising:
a third active switch configured to couple the input voltage to the ground in response to the second input voltage being greater than zero.

4. The apparatus of claim 3, wherein the comparator is further configured to compare a second input voltage to the output voltage to provide a second control signal, and wherein the apparatus further comprises:
a fourth active switch configured to establish a second conducting path to couple the second input voltage to the output voltage when the second control signal indicates the second input voltage is greater than the output voltage.

5. The apparatus of claim 4, wherein the input voltage and the second input voltage are configured and arranged to form a differential input voltage.

6. The apparatus of claim 4, further comprising:
a diode configured and arranged to be in parallel with the conducting path; and
a second diode configured and arranged to be in parallel with the second conducting path.

7. The apparatus of claim 1, wherein the comparator comprises:
a first current mirror configured to mirror a current representation of the output voltage to provide an output current;
a second current mirror configured to mirror a current representation of the input voltage to provide an input current; and
an output terminal configured to combine the output current and the input current to provide the control signal.

8. The apparatus of claim 7, wherein the control signal indicates the input voltage is greater than the output voltage when the input current is greater than the output current.

9. The apparatus of claim 1, wherein the apparatus is implemented as a part of a near field communications (NFC) device.

10. An apparatus, comprising:
a comparator configured to compare a first input voltage to an output voltage to provide a control signal;
an active switch configured to establish a conducting path to couple the first input voltage to the output voltage in response to the control signal; and
a second active switch configured to couple a second input voltage to a ground in response to the input voltage being greater than zero and to decouple the second input voltage, from the ground in response to the input voltage being Jess than or equal to zero.

11. The apparatus of claim 10, further comprising:
a third active switch configured to couple the first input voltage to the ground in response to the second input voltage being greater than zero.

12. The apparatus of claim 11, wherein the comparator is further configured to compare the second input voltage to the output voltage to provide a second control signal, and wherein the apparatus further comprises:
a fourth active switch configured to establish a second conducting path to couple the second input voltage to the output voltage in response to a second control signal.

13. The apparatus of claim 11, further comprising:
an inductive coupler configured to inductively receive a communications signal and to provide the first and the second input voltages therefrom.

14. The apparatus of claim 10, wherein the input voltage and the second input voltage are configured and arranged to form a differential input voltage.

15. A near field communications (NFC) device, comprising:
an inductive coupler configured to inductively receive a communications signal and to provide an input voltage therefrom;
a rectifier configured to compare the input voltage to an output voltage and to couple the input voltage to the output voltage when the input voltage is greater than the output voltage and to not couple the input voltage to the output voltage when the input voltage is less than the output voltage.

16. The NFC device of claim 15, further comprising:
a demodulator configured to recover information from the communications signal.

17. The NFC device of claim 15, wherein the NFC device is implemented as part of an NFC-enabled communications device.

18. The NFC device of claim 17, wherein the NFC-enabled communications device is a mobile telephone.

19. The NFC device of claim 17, wherein the rectifier comprises:
a comparator configured to compare the input voltage to the output voltage to provide a control signal; and
an active switch configured to establish a conducting path to couple the input voltage to the output voltage in response to the control signal.

20. The NFC device of claim 19, wherein the rectifier further comprises:
a second active switch configured to couple a second input voltage to a ground in response to the control signal.

* * * * *

UNITED STATES PATENT AND TRADEMARK OFFICE
CERTIFICATE OF CORRECTION

| | | |
|---|---|---|
| PATENT NO. | : 8,326,224 B2 | Page 1 of 1 |
| APPLICATION NO. | : 12/863614 | |
| DATED | : December 4, 2012 | |
| INVENTOR(S) | : Paul Butler | |

It is certified that error appears in the above-identified patent and that said Letters Patent is hereby corrected as shown below:

Title Page, Item (75), please replace "Cirencester" with --Goucestershire--.

In the Claims:
Column 15, lines 31-32, claim 10, please replace "voltage, from the ground" with --voltage from the ground--.

Signed and Sealed this
Sixth Day of August, 2013

Teresa Stanek Rea
*Acting Director of the United States Patent and Trademark Office*